(12) United States Patent
Strasser et al.

(10) Patent No.: US 9,000,520 B2
(45) Date of Patent: *Apr. 7, 2015

(54) SEMICONDUCTOR DEVICE WITH AN INSULATING STRUCTURE FOR INSULATING AN ELECTRODE FROM A SEMICONDUCTOR BODY

(71) Applicant: Infineon Technologies Dresden GmbH, Dresden (DE)

(72) Inventors: Marc Strasser, Unterhaching (DE); Karl-Heinz Gebhardt, Dresden (DE); Ralf Rudolf, Dresden (DE); Lincoln O'Riain, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/177,989

(22) Filed: Feb. 11, 2014

(65) Prior Publication Data

US 2014/0159154 A1    Jun. 12, 2014

Related U.S. Application Data

(63) Continuation of application No. 13/560,109, filed on Jul. 27, 2012, now Pat. No. 8,686,505.

(51) Int. Cl.
*H01L 29/78* (2006.01)
*H01L 29/66* (2006.01)
*H01L 29/06* (2006.01)
*H01L 29/08* (2006.01)
*H01L 29/10* (2006.01)

(52) U.S. Cl.
CPC ...... *H01L 29/7816* (2013.01); *H01L 29/66681* (2013.01); *H01L 29/0653* (2013.01); *H01L 29/063* (2013.01); *H01L 29/0878* (2013.01); *H01L 29/1095* (2013.01)

(58) Field of Classification Search
None
See application file for complete search history.

(56) References Cited

U.S. PATENT DOCUMENTS

| 4,635,090 | A | 1/1987 | Tamaki et al. |
| 6,242,787 | B1 | 6/2001 | Nakayama et al. |
| 8,139,563 | B2 | 3/2012 | Jackson et al. |
| 8,686,505 | B2 * | 4/2014 | Strasser et al. ............... 257/343 |
| 2004/0224492 | A1 | 11/2004 | Yang et al. |
| 2007/0069308 | A1 | 3/2007 | Ko |
| 2010/0207233 | A1 | 8/2010 | Gambino et al. |
| 2011/0003458 | A1 | 1/2011 | Lee et al. |
| 2011/0089492 | A1 | 4/2011 | Yilmaz |

* cited by examiner

*Primary Examiner* — Joseph Schoenholtz
(74) *Attorney, Agent, or Firm* — Murphy, Bilak & Homiller, PLLC

(57) ABSTRACT

A semiconductor device includes an electrode arranged on a main surface of a semiconductor body and an insulating structure insulating the electrode from the semiconductor body. The insulating structure includes in a vertical cross-section a gate dielectric portion forming a first horizontal interface at least with a drift region of the device and having a first maximum vertical extension between the first horizontal interface and the electrode, and a field dielectric portion forming with the drift region second, third and fourth horizontal interfaces. The second through fourth horizontal interfaces are arranged below the main surface. The third horizontal interface is arranged between the second and fourth horizontal interfaces. A second maximum vertical extension is larger than the first maximum vertical extension and a third maximum vertical extension is larger than the second maximum vertical extension. The electrode only partially overlaps the third horizontal interface.

10 Claims, 9 Drawing Sheets

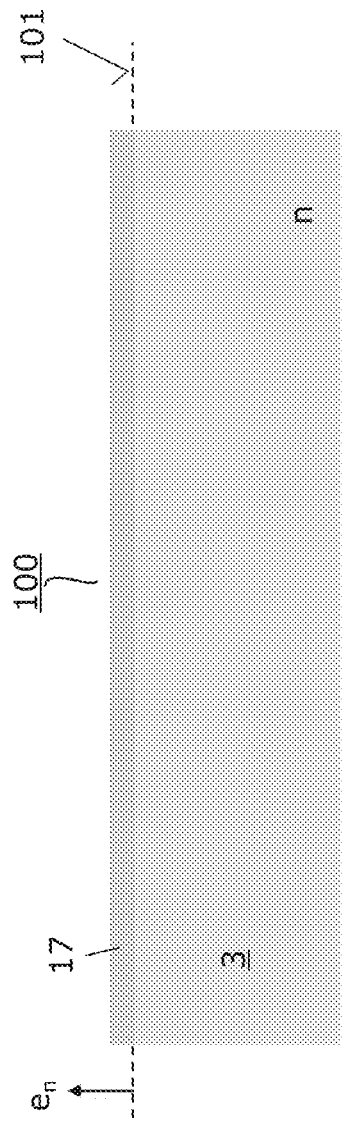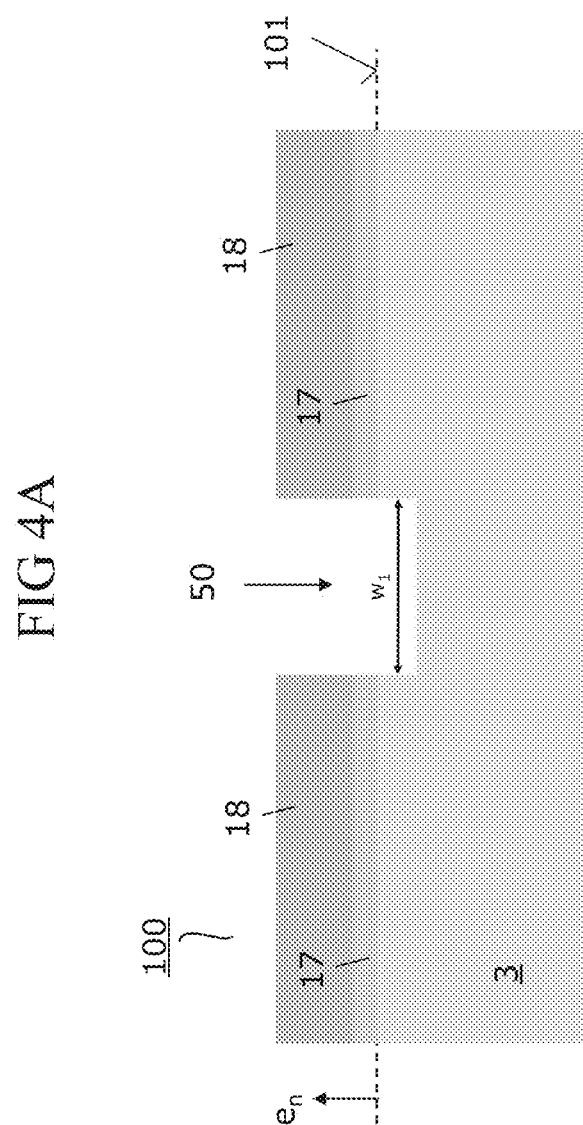

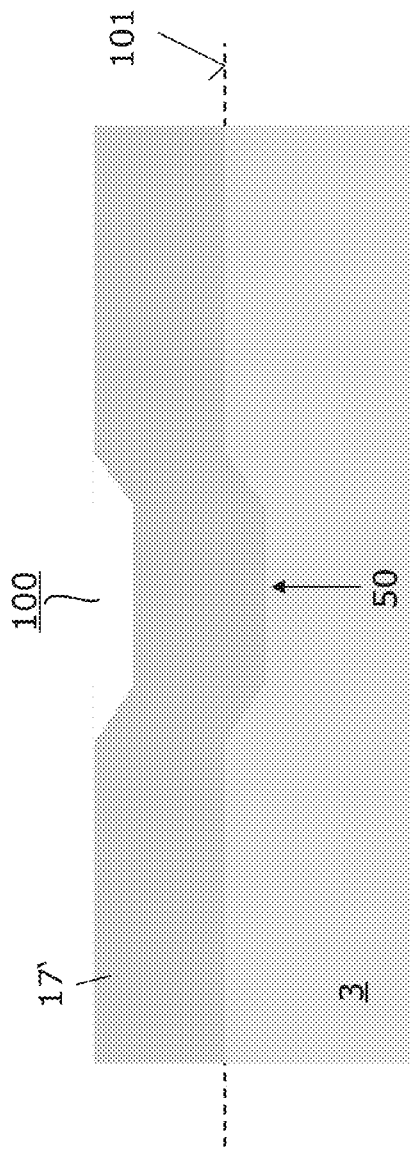
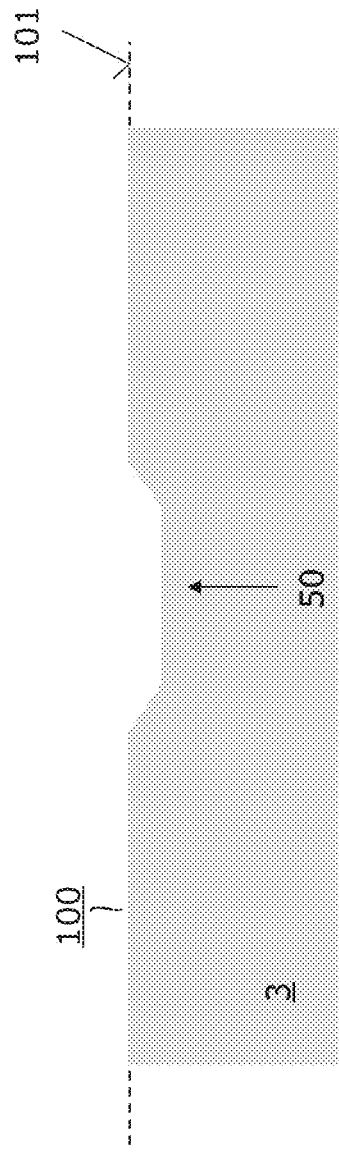

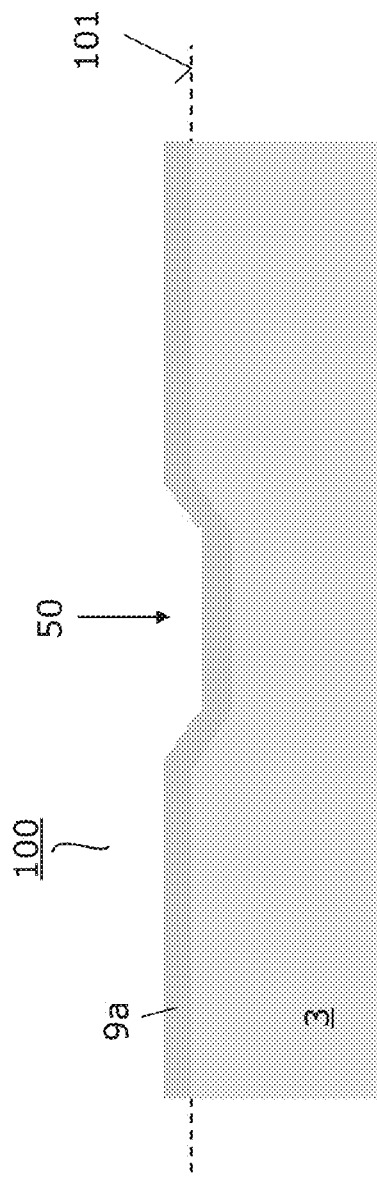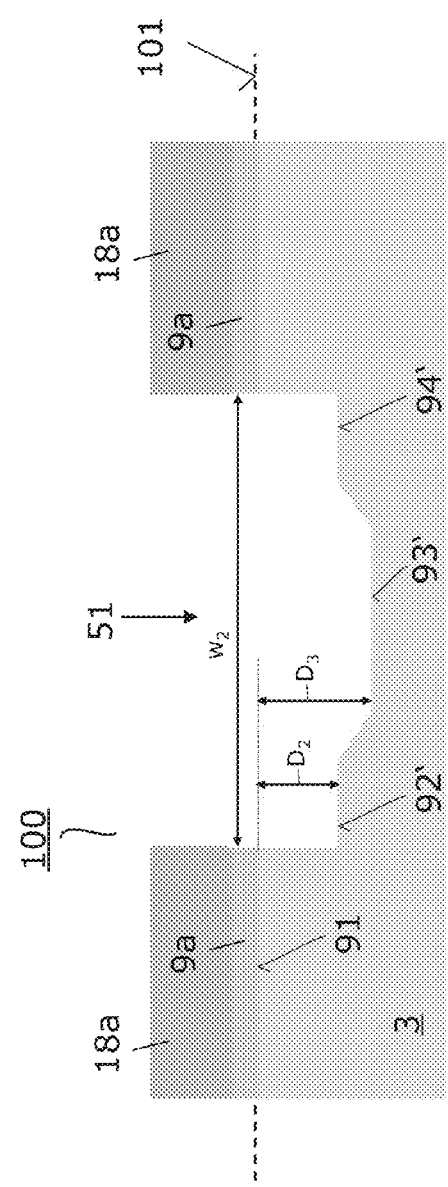

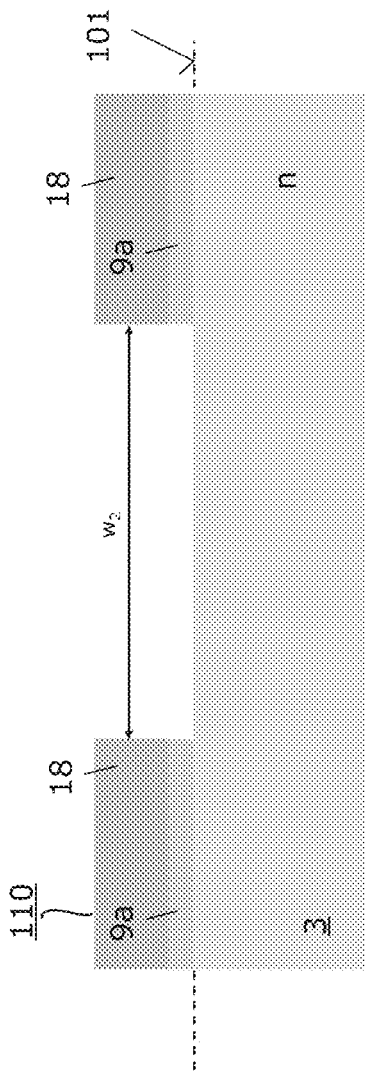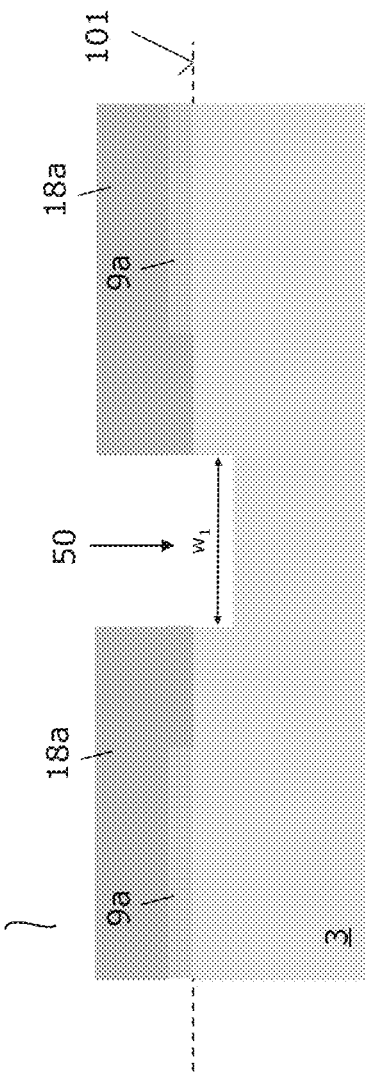

SEMICONDUCTOR DEVICE WITH AN INSULATING STRUCTURE FOR INSULATING AN ELECTRODE FROM A SEMICONDUCTOR BODY

PRIORITY CLAIM

This application is a continuation of U.S. application Ser. No. 13/560,109 filed 27 Jul. 2012, the content of said application incorporated herein by reference in its entirety.

TECHNICAL FIELD

Embodiments of the present invention relate to lateral semiconductor devices, in particular to lateral power semiconductor transistors having an insulated field plate, and to related methods for producing semiconductor devices.

BACKGROUND

Semiconductor transistors, in particular field-effect controlled switching devices such as a Metal Oxide Semiconductor Field Effect Transistor (MOSFET) and an Insulated Gate Bipolar Transistor (IGBT) have been used for various applications including but not limited to use as switches in power supplies and power converters, electric cars, air-conditioners, and even stereo systems. Particularly with regard to power devices capable of switching large currents and/or operating at higher voltages, low on-state resistance $R_{on}$ and high breakdown voltages are often desired.

To increase the breakdown voltage of lateral field-effect transistors, for example of an LDMOS (Lateral Diffused Metal Oxide Semiconductor device) manufactured using a double diffusion process and with drain, drift and source regions extending to a main surface, a field electrode may be arranged on a field oxide extending along the drift region next to the main surface. The field oxide may be formed using a LOCOS process (LOCal Oxidation of Silicon). The breakdown voltage of the semiconductor devices with such a field redistributing structure is mainly determined by the dielectric properties and the vertical thickness of the field oxide.

However, thicker field oxides may increase the on-state resistance $R_{on}$. In particular when semiconductor structures of different rated breakdown voltages are to be integrated in a single integrated semiconductor device, for example a power transistor and a measuring circuitry and or a logic circuitry formed in CMOS-technology (complementary MOS) or BiCMOS-technology (combing bipolar junction transistors and CMOS transistors) such as BCD-technology (Bipolar-CMOS-DMOS), the on-state resistance $R_{on}$ of the semiconductor transistors with lower rated blocking voltage may significantly be increased when corresponding field oxides are formed in a common LOCOS-process.

Accordingly, there is a need to improve field redistributing structures of lateral semiconductor devices and manufacturing methods therefor.

SUMMARY

According to an embodiment of a semiconductor device, the semiconductor device includes a semiconductor body having a main surface with a normal direction defining a vertical direction, an electrode arranged on the main surface, and an insulating structure which insulates the electrode from the semiconductor body. The semiconductor body includes, in a vertical cross-section, a first contact region of a first conductivity type which extends to the main surface, a body region of a second conductivity type which adjoins the first contact region and extends to the main surface, a drift region of the first conductivity type which adjoins the body region and extends to the main surface, and a second contact region which has a higher maximum doping concentration than the drift region and extends to the main surface. The insulating structure includes in the vertical cross-section, a gate dielectric portion which forms a first horizontal interface at least with the drift region and has a first maximum vertical extension between the first horizontal interface and the electrode; and a field dielectric portion which forms with the drift region a second horizontal interface and a third horizontal interface which are, in the vertical direction, arranged below the main surface. A second maximum vertical extension of the field dielectric portion between the second horizontal interface and the electrode is, in the vertical direction, larger than the first maximum vertical extension. A third maximum vertical extension of the field dielectric portion between the third horizontal interface and the electrode is, in the vertical direction, larger than the second maximum vertical extension.

According to an embodiment of a semiconductor device, the semiconductor device includes a semiconductor body having a main surface with a normal direction defining a vertical direction, an electrode arranged on the main surface, and an insulating structure which insulates the electrode from the semiconductor body. The semiconductor body includes a first contact region of a first conductivity type arranged next to the main surface, a body region of a second conductivity type which forms with the first contact region a first pn-junction extending to the main surface, a drift region of the first conductivity type which forms with the body region a second pn-junction extending to the main surface, and a second contact region which has a higher maximum doping concentration than the drift region and is arranged next to the main surface. The insulating structure forms a semiconductor-insulator interface at least with the drift region. The semiconductor-insulator interface includes a first horizontal interface portion, a second horizontal interface portion which is arranged vertically below the main surface and the first horizontal interface portion, and a third horizontal interface portion which is arranged vertically below the second horizontal interface portion.

According to an embodiment of a method for producing a lateral field-effect semiconductor device, the method includes: providing a semiconductor body comprising a first semiconductor region of a first conductivity type extending to a main surface having a normal direction defining a vertical direction; forming on the first semiconductor region a first mask having a first opening which has, in a vertical cross-section, a first horizontal extension; forming a first trench in the first semiconductor region using the first mask; forming on the first semiconductor region a second mask having a second opening which has, in the vertical cross-section, a second horizontal extension which is larger than the first horizontal extension; forming a first trench in the first semiconductor region using the first mask; anisotropically etching the first semiconductor region through the second mask to form a widened first trench; depositing a dielectric material to fill the widened first trench; and planarizing the dielectric material to form an insulating structure. The first mask and the second mask being formed such that at least one of the first opening and the first trench is arranged within the second opening when seen from above.

According to an embodiment of a method for producing a semiconductor device, the method includes providing a semiconductor body comprising a drift region of a first conductivity type which extends to a main surface having a normal direction defining a vertical direction, and forming a lateral field-effect-structure. Forming a lateral field-effect-structure includes: forming a body region of a second conductivity type in the drift region; forming a first contact region of a first conductivity type in the body region; forming next to the main surface a second contact region in the drift region which comprises a higher maximum doping concentration than the drift region; forming a dielectric structure; and forming an electrode on the main surface such that the insulating structure includes a gate dielectric portion which forms a first horizontal interface at least with the drift region and has a first maximum vertical extension between the first horizontal interface and the electrode, and a field dielectric portion which forms with the drift region a second horizontal interface and a third horizontal interface which are, in the vertical direction, arranged below the main surface. A second maximum vertical extension of the field dielectric portion between the second horizontal interface and the electrode is larger than the first maximum vertical extension. A third maximum vertical extension of the field dielectric portion between the third horizontal interface and the electrode is larger than the second maximum vertical extension.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 4A to 7 illustrate vertical cross-sections through a semiconductor body during method steps of a method according to embodiments; and FIGS. 8A to 9B illustrate vertical cross-sections through a semiconductor body during method steps of a method according to embodiments.

DETAILED DESCRIPTION

Figure 1:
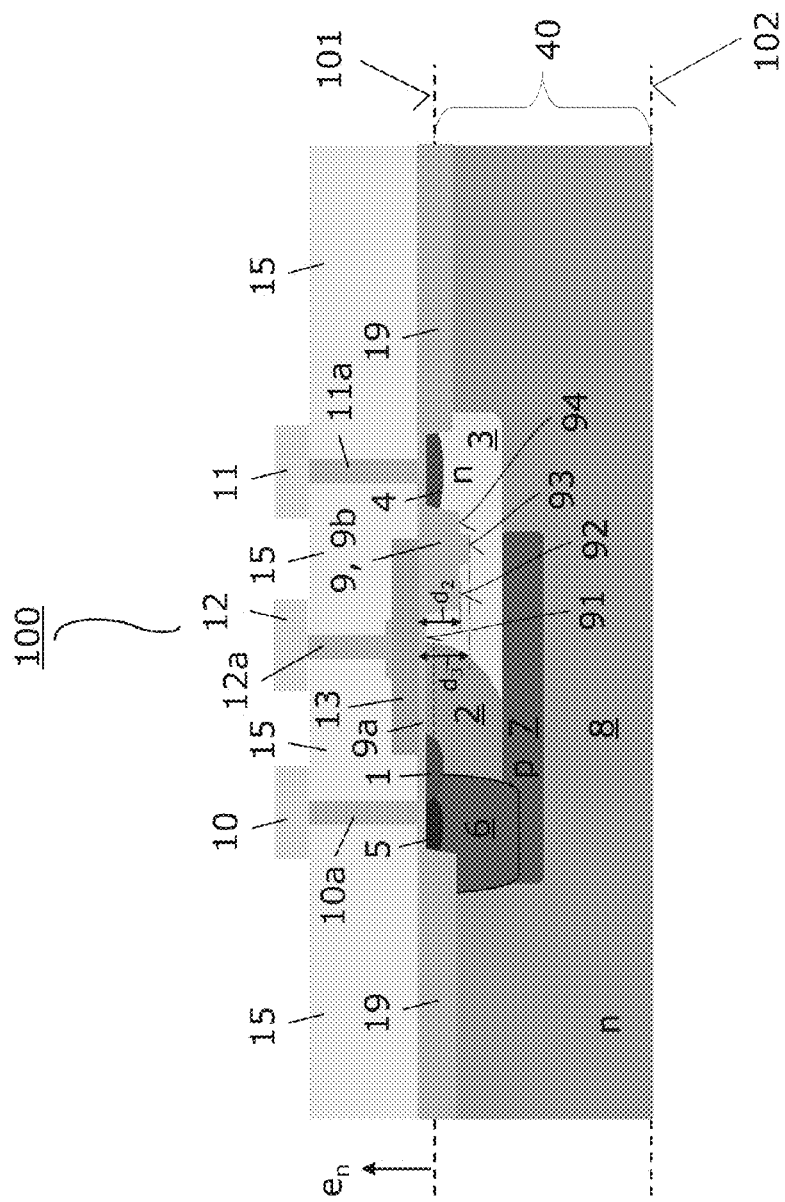
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as a first conductivity type while p-doped is referred to as a second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to semiconductor devices, in particular to field effect semiconductor transistor and manufacturing methods therefor. Within this specification the terms "semiconductor device" and "semiconductor component" are used synonymously. The semiconductor device typically includes a field-effect structure, such as an IGBT-structure or a MOSFET, having a pn-junction forming a body diode between a drift region of the first conductivity type and a body region of the second conductivity type. The field-effect structure is typically a lateral field-effect structure, for example a DMOS-structure with two contact regions arranged next to a first surface of the semiconductor body. Two load metallizations, each of which is in low resistive electric contact with one of the two contact regions, and an insulated gate electrode are typically arranged on the first surface. The first surface is also referred to below as the main surface.

The term "commutating" as used in this specification intends to describe the switching of the current of a semiconductor device from a forward direction, or conducting direction, in which a pn-load junction, for example the pn-junction between the body region and the drift region, is forwardly biased in a direction that is opposite, or reverse, of the direction in which the pn-load junction is reversely biased. Operating the semiconductor device with a reversely biased pn-load junction is also referred to below as operating the semiconductor device in a blocking mode. Likewise, operating the semiconductor device with forwardly biased pn-load junction is also referred to below as operating the semiconductor device in a forward mode. The term "hard commutating" as used in this specification intends to describe commutating with a speed of at least about $10^{10}$ V/s, more typically with a speed of at least about $2*10^{10}$ V/s.

Typically, the semiconductor device is a power semiconductor device having an active area with a plurality of IGBT-cells or MOSFET-cells for carrying and/or controlling a load current between the two load metallizations. Furthermore, the power semiconductor device typically has a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range. Within this specification, the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in low resistive electric contact with a drain or collector electrode. The source region or emitter region is in low resistive electric contact with a source or emitter electrode.

In the context of the present specification, the terms "in resistive electric contact" and "in resistive electric connection" intend to describe that there is a resistive current path between respective elements or portions of a semiconductor device at least when no voltages are applied to and/or across the semiconductor device. Likewise, the terms "in low resistive electric contact" and "in low resistive electric connection" intend to describe that there is a low resistive current path between respective elements or portions of a semiconductor device at least when no voltages are applied to and/or across the semiconductor device. Within this specification the terms "in low resistive electric contact", "electrically coupled", and "in low resistive electric connection" are used synonymously. In some embodiments, the resistivity of a low resistive current path between respective elements or portions of a semiconductor device which is low when low voltages are applied to and / or across the semiconductor device, for example a probe voltage of less than one or a few volts, becomes high above a threshold voltage, for example due to depleting a semiconductor region forming at least a part of the current path.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used as a more general term than IGFET (insulated-gate field-effect transistor) and MISFET (metal-insulator-semiconductor field-effect transistor), respectively.

In the context of the present specification, the term "gate electrode" intends to describe an electrode which is situated next to, and insulated from, the body region and configured to form and/or control a channel region through the body region.

In the context of the present specification, the term "field electrode" intends to describe an electrode which is arranged next to a semiconductor region, typically the drift region, is insulated from the semiconductor region and the semiconductor body, respectively, and is configured to expand a depleted portion in the semiconductor region by charging to an appropriate voltage with regard to the surrounding semiconductor region, i.e., typically a negative voltage for an n-type semiconductor region.

Typically, the field electrode is formed by a conductive region, arranged in or on the semiconductor body and is insulated from the semiconductor body by an insulating region forming a field dielectric region. During the blocking mode, charges, typically negative charges for an n-type semiconductor region adjoin the insulating region, so that a portion of the semiconductor region is depleted by the charges. The conductive region may be made of a material with high enough electric conductivity so that the conductive region forms an equipotential region during device operation. For example, the conductive region may be made of a material with metallic or near-metallic electric conductivity such as a metal, for example wolfram (i.e., tungsten), highly doped poly-silicon, a silicide or the like. Typically, the conductive region is in resistive electric connection with a gate metallization of the semiconductor device. Furthermore, only a portion of the conductive region may form a field electrode while another portion may form the gate electrode of the field-effect structure. The insulating region may be made of any suitable dielectric material such as silicon oxide, for example thermal silicon oxide, silicon nitride, siliconoxynitride or the like.

In the context of the present specification, the term "mesa" or "mesa region" intends to describe a semiconductor region between two adjacent trenches extending into the semiconductor substrate or body in a vertical cross-section.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance $R_{on}$ in the following also referred to as on-resistance $R_{on}$.

With reference to FIG. 1, a first embodiment of a semiconductor device 100 is explained. FIG. 1 illustrates a vertical cross-section through a semiconductor body 40 of semiconductor device 100. Semiconductor body 40 extends between a main surface 101 which has a normal direction defining a vertical direction $e_n$ and a second surface 102 which is arranged opposite to the main surface 101. In the following, the main surface 101 is also referred to as the main horizontal surface. In one embodiment, the semiconductor device 100 is implemented as a lateral MOSFET. In this embodiment, a first load metallization 10 forming a source metallization, a second load metallization 11 forming a drain metallization, and a gate metallization 12 are typically arranged on the main surface 101 and insulated from each other.

In another embodiment, semiconductor device 100 forms an IGBT. In this embodiment, the first load metallization 10 forms an emitter metallization and the second load metallization 11 forms a collector metallization.

Note that the cross-section illustrated in FIG. 1 may only correspond to a section of a more complex semiconductor device, for example an integrated semiconductor device which includes further semiconductor structures such as analog or digital measuring or control structures, for example CMOS or BiCMOS-structures such as BCD-structures.

The first load metallization 10 is in low resistive contact with a first contact region 1 of a first conductivity type which is arranged next to the main surface 101. A body region 2 of a second conductivity type adjoins the first contact region 1 and forms with the first contact region 1 a first pn-junction which extends to the main surface 101. A drift region 3 of the first conductivity type adjoins the body region 2 and forms with the body region 2 a second pn-junction which extends to the main surface 101. The second load metallization 11 is in low resistive contact with a second contact region 4 of a second conductivity type which is arranged next to the main surface 101 and has a higher maximum doping concentration than the drift region 1.

In the exemplary embodiment, the first contact region 1, the second contact region 4, the body region 2 and the drift region 3 extend to the main surface 101.

The second contact region 4 may be of the first conductivity type and form a drain region of a lateral MOSFET-structure. In this embodiment, the first contact region 1 forms a source region.

Alternatively, the second contact region 4 is of the second conductivity type and forms a collector region of a lateral IGBT-structure. In this embodiment, the first contact region 1 forms an emitter region.

Note that semiconductor device 100 may include a plurality of unit cells as illustrated in FIG. 1 which are connected to common load metallizations 10, 11 and a common gate metallization 12.

Furthermore, a field-stop region of the first conductivity type having a higher maximum doping concentration than the drift region 3 may be arranged between the second contact region 4 and the drift region 3.

An electrode 13 is arranged on the main surface 101 and insulated from the semiconductor body 40 by an insulating structure 9. The electrode 13 is in low resistive electric contact with the gate metallization 12. In the exemplary embodiment, the first load electrode 10, the second load electrode 11 and the electrode 13 are electrically connected with the respective metallizations 10, 11, 12 by respective through contacts 10a, 11a, 12a which extend through an interlayer dielectric 15 arranged on the main surface 101. The interlayer dielectric 15 may be made of any suitable dielectric material such as silicon oxide (SiO2), silicon nitride (SiN) and silicon oxynitride (SiOxNy), TEOS (TetraEthylOrthoSilicat), USG (Undoped Silicate Glass), an HDP-oxide (High Density Plasma-oxide) or a doped oxide, for example PSG (PhosphoSilicate Glass), BPSG (BoroPhosphoSilicate) or BSG (BoroSilicate Glass).

Electrode 13 has a first portion which extends, in a horizontal direction, from the first contact region 1 along the body region 2 and at least to the drift region 3, and second portion which adjoins the first portion, is arranged above the drift region 3 and spaced apart from the body region 2. The insulating structure 9 has a gate dielectric portion 9a which is arranged between the semiconductor body and the first portion of electrode 13 forming a gate electrode, and a field dielectric portion 9b which adjoins the gate dielectric portion 9a and is arranged between the drift region 3 and the second portion of electrode 13 forming a field electrode.

The gate dielectric portion 9a is arranged on the main surface 101 and extends in the horizontal direction at least between the first and second pn-junctions. Accordingly, a channel region (indicated by the dashed horizontal line in FIG. 1) may be formed in an adjoining portion of the body region 2 by applying an appropriate voltage difference between the gate metallization 12 and the first load metallization 10.

The field dielectric portion 9b extends along and into the drift region 3 and has a higher vertical extension compared to the gate dielectric portion 9a. Accordingly, the breakdown voltage of semiconductor device 100 is typically increased.

Typically, the insulating structure 9a, 9b is formed by a contiguous dielectric region 9. Dielectric region 9 may be made of any suitable dielectric material such as silicon oxide (SiO2), silicon nitride (SiN) and silicon oxynitride (SiOxNy) but may also be made of high-dielectric constant materials such as hafnium oxide (HfO) or the like.

Figure 2:
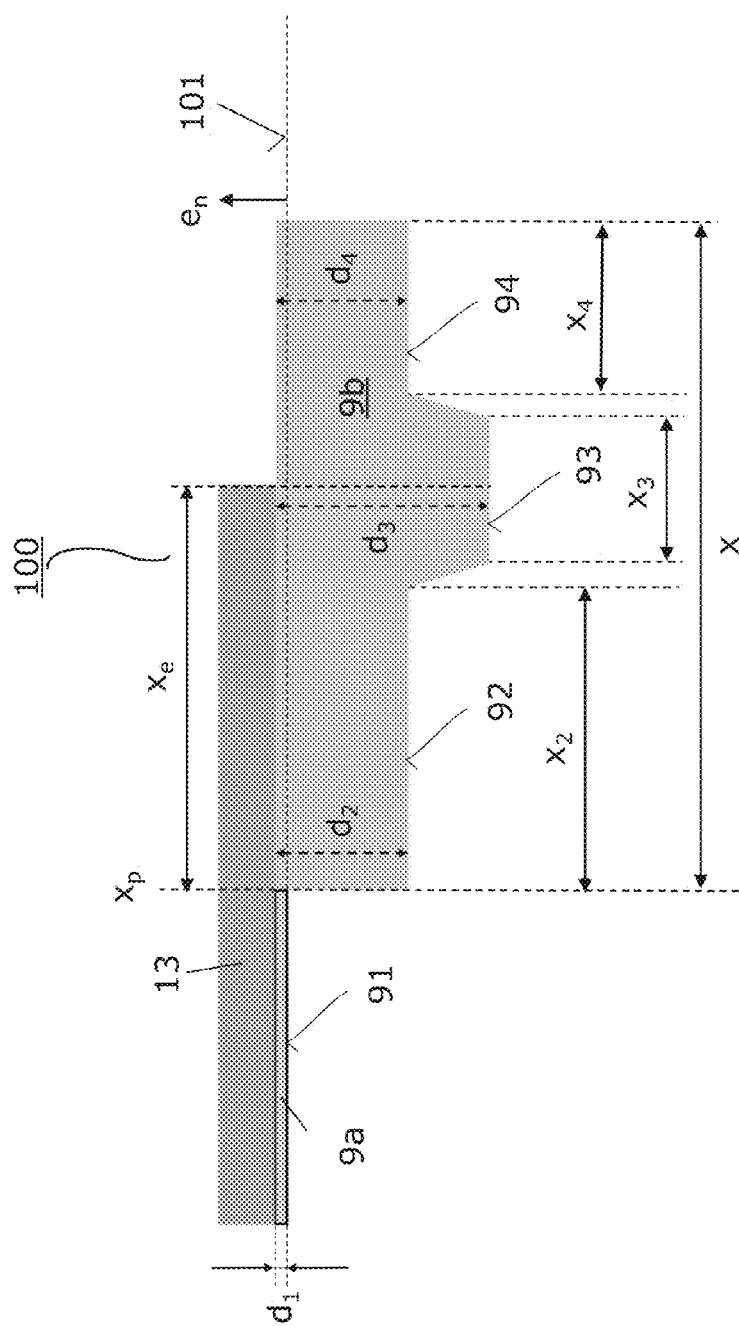
FIG. 2 illustrates a subsection of the vertical cross-section through the semiconductor device illustrated in FIG. 1 according to an embodiment.

According to an embodiment, the gate dielectric portion 9a forms a first horizontal interface 91 with the drift region 3, the body region 2 and the source region 1, and the field dielectric portion 9b forms with the drift region a second horizontal interface 92 and a third horizontal interface 93 which are both arranged below the main surface 101. A second maximum vertical extension $d_2$ of the field dielectric portion 9b between the second horizontal interface 92 and the electrode 13 is larger than a first maximum vertical extension $d_1$ between the first horizontal interface 91 and electrode 13. A third maximum vertical extension $d_3$ of the field dielectric portion 9b between the third horizontal interface 93 and the electrode 13 is larger than the second maximum vertical extension $d_2$. This is illustrated in more detail in FIG. 2 showing an enlarged subsection of the cross-section illustrated in FIG. 1. Accordingly, the field dielectric portion may be suitably thickened so that the breakdown voltage is further increased without significantly reducing the on-resistance. The third maximum vertical extension $d_3$ may, for example, be larger than the second maximum vertical extension $d_2$ by a factor of at least about 1.2.

According to an embodiment, the insulating structure 9 forms a semiconductor-insulator interface with the drift region 3, the body region 2, and the first contact region 1. The semiconductor-insulator interface includes a first horizontal interface portion 91, a second horizontal interface portion 92 which is arranged vertically below the main surface 101 and the first horizontal interface portion 91, and a third horizontal interface portion 93 which is arranged vertically below the second horizontal interface portion 92.

Typically, the field dielectric portion 9b forms with the drift region 3 a fourth horizontal interface 94 which is, in the vertical direction, arranged below the first horizontal interface 91. The third horizontal interface 93 is arranged between the second horizontal interface 92 and the fourth horizontal interface 94 when seen from above. In the following the fourth horizontal interface 94 is also referred to as a fourth horizontal interface portion of the semiconductor-insulator interface formed between the insulating structure 9 and the semiconductor body 40.

Furthermore, the field dielectric portion 9b typically extends to the second contact region 4 to ensure a large breakdown voltage.

In the exemplary embodiment illustrated in FIG. 1, the drift region 3 is formed and embedded, respectively, in a substrate 8 of the first conductivity type. Substrate 8 may form a common substrate of an integrated semiconductor device which includes further semiconductor structures such as CMOS- or BiCMOS-structures which are laterally spaced apart form the three terminal field-effect structure illustrated in FIG. 1. An insulating layer 19 is typically arranged on substrate 8 and may have a vertical extension which substantially matches the second maximum vertical extension $d_2$. Portions of insulating layer 19 may form a field oxide of at least one of the further semiconductor structures. Accordingly, the second maximum vertical extension $d_2$ may be chosen in accordance with a rated breakdown voltage of at least one of the further semiconductor structures which is lower than the rated breakdown voltage of the field-effect structure illustrated in FIG. 1. This facilitates manufacturing of integrated semiconductor devices having semiconductor structures with different rated breakdown voltages without significantly affecting the on-resistances.

Typically, body region 2 is also in low resistive electric contact with the first load metallization 10 to avoid latch-up. In the exemplary embodiment illustrated in FIG. 1, this is provided via a highly doped body contact region 5 of the second conductivity type and a deep body connection region 6 of the second conductivity type which may have a maximum doping concentration between a maximum doping concentration of the body region 4 and a maximum doping concentration of the body contact region 5. Furthermore, a deep body region 7 having a higher maximum doping concentration than the body region 4 may adjoin and be arranged below the body region 2 and the deep body connection region 6.

When seen from above, the electrode 13 typically overlaps with the first contact region 1, the body region 2, the drift region 3, the gate dielectric portion 9a, the field dielectric portion 9b, the first horizontal interface 91, the second horizontal interface 92, the third horizontal interface 93 and the deep body connection region 6. More typically, the electrode 13 only partially overlaps the third horizontal interface 93 and not with the fourth horizontal interface 94 when seen from above. This ensures that the field dielectric portion 9b has its largest vertical extension where the electrode 13 ends above the drift region 3. Accordingly, a particularly low on-resistance and a particularly high break-down voltage are typically achieved with a combined gate and field electrode 13 which is in the vertical cross-section substantially bar-shaped. In addition, this typically saves costs during manufacturing semiconductor device 100.

Referring again to FIG. 2, further embodiments are explained. For sake of clarity, only electrode 13 and insulating structure 9 of semiconductor device 100 are illustrated in FIG. 2. When seen from above, electrode 13 typically extends close to a center of the third horizontal interface 93. This means that a horizontal extension $x_e$ of electrode 13, as measured above the drift region 3 and from a position $x_p$ where the first horizontal interface 91 and the second horizontal interface 92 adjoin when seen from above is typically equal to or somewhat larger than a sum of a horizontal extension $x_2$ of the second horizontal interface 92 and half of a horizontal extension $x_3$ of the third horizontal interface 93. Furthermore, the horizontal extension $x_2$ may be chosen larger than a horizontal extension $x_4$ of the fourth horizontal interface 94, for example by a factor of more than about two or even more than about 5, to ensure a particularly low on-resistance. In other embodiments, the horizontal extension $x_2$ may be chosen smaller than the horizontal extension $x_4$ to ensure a particularly high breakdown voltage. The total horizontal extension x of a part of insulating structure 9 which is arranged below may, depending on voltage class, range from about 1 μm to about 15 μm.

Typically, the second horizontal interface 92 and the fourth horizontal interface 94 are coplanar and arranged substantially in a common horizontal plane, respectively. For example, a maximum vertical extension $d_4$ of the field dielectric portion 9b substantially matches the second maximum vertical extension $d_2$.

In the exemplary embodiment, a lowermost portion of insulating structure 9 which extends to the third horizontal interface 93 is tapered. Accordingly, the second horizontal interface 92, the third horizontal interface 93 and the fourth horizontal interface 94 are spaced apart from each other when seen from above. In other embodiments, the third horizontal interface 93 adjoins the second horizontal interface 92 and the fourth horizontal interface 94 when seen from above.

Figure 3:
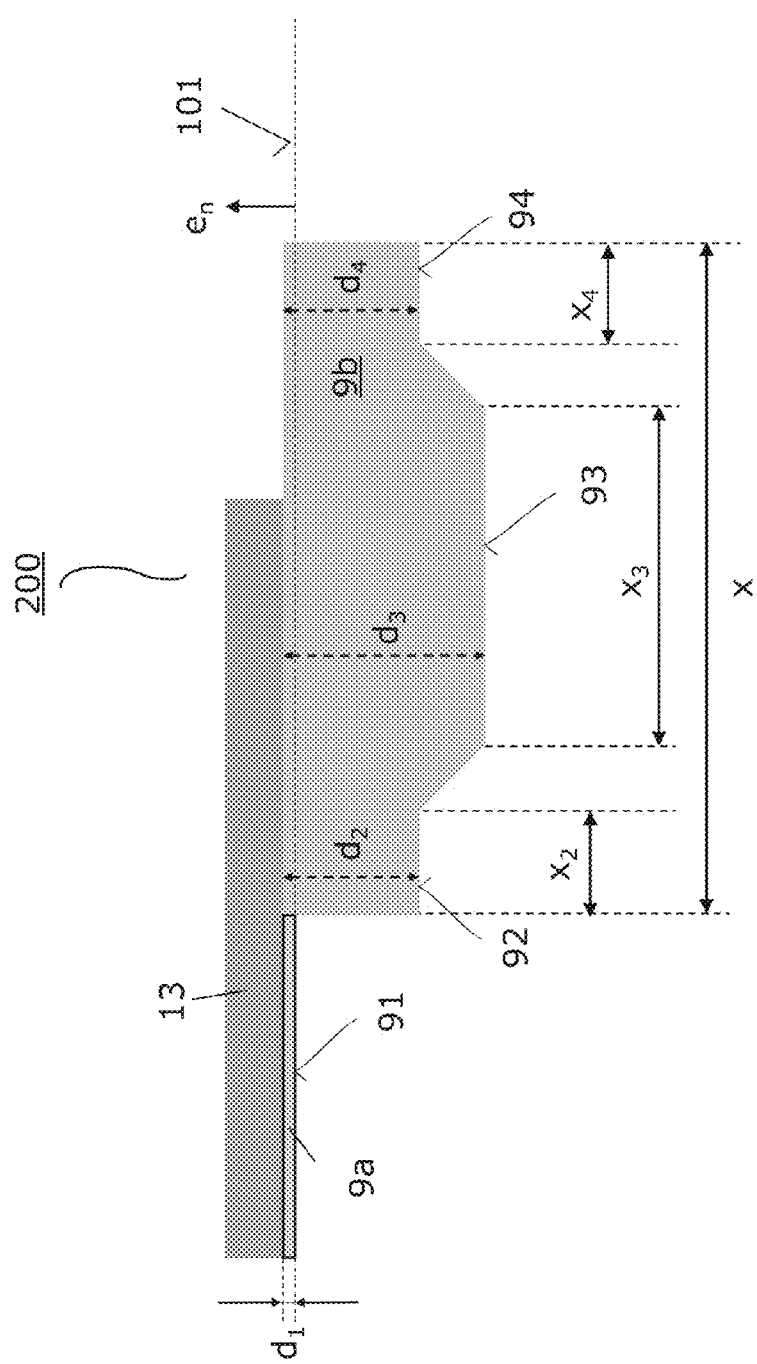
FIG. 3 illustrates a vertical cross-section through a semiconductor device according to an embodiment.

FIG. 3 shows a vertical cross-section through a semiconductor device 200. Semiconductor device 200 is similar to the semiconductor device 100 illustrated above with regard to FIGS. 1, 2. However, the horizontal extension $x_2$ of the second horizontal interface 92 is smaller than the horizontal extension $x_3$ of the third horizontal interface 93 and substantially equal to the horizontal extension $x_4$ of the fourth horizontal interface 94.

FIGS. 4A to 7 illustrate a method for forming a semiconductor device 100 according to several embodiments. These figures show vertical cross-sections through a semiconductor body during or after particular method steps. In a first process, a semiconductor body, typically a Si-wafer or Si-substrate, having a main surface 101 and a backside surface arranged opposite to the main surface 101 is provided. The normal direction of main surface 101 defines a vertical direction $e_n$. As illustrated in FIG. 4A, the semiconductor body typically includes a first semiconductor region 3 of a first conductivity type (n-type in the exemplary embodiment) which extends to the main surface 101. Typically, the first semiconductor region 3 or a portion of the first semiconductor region 3 forms a drift region in the semiconductor device to be manufactured. The first semiconductor region 3 may be formed as a well in a common substrate extending between main surface 101 and the backside surface (not shown in FIG. 4A), for example by implantation and thermal drive-in. Furthermore, the semiconductor body is typically covered on main surface 101 with a screen oxide layer 17.

Thereafter, a mask 18 is formed on main surface 101 and a screen oxide layer 17, respectively. Forming mask 18 may include depositing a resin and photo-lithographically structuring the resin. Thereafter, screen oxide layer 17 may be etched through mask 18 to form a first mask 17 which has a first opening with a first horizontal extension $w_1$.

Thereafter, a first trench 50 is formed from the main surface 101 into the first semiconductor region 3 using the first mask 17. The resulting semiconductor structure 100 is illustrated in FIG. 4B.

The first trench 50 is typically etched into the first semiconductor region 3 using an isotropic etching process. Accordingly, the first trench 50 has, in a vertical cross-section, the first horizontal extension $w_1$. Typically, the vertical extension of the first trench 50 is in a range from about 50 nm to about 1 μm, more typically in a range from about 100 nm to about 500 nm. Furthermore, the horizontal extension $w_1$ of the first trench 50 in the shown vertical cross-section is typically in a range from about 300 nm to about 50 μm, more typically in a range from about 500 nm to about 10 μm.

In the exemplary embodiment, vertical trench 50 has a substantially horizontal bottom wall and substantially vertical side walls. Note that semiconductor device 100 is typically manufactured at wafer-level. Accordingly, a plurality of semiconductor device 100 may be manufactured in parallel. Furthermore, each of the semiconductor devices 100 to be manufactured may includes several field oxides. Accordingly, a plurality of vertical trench 50 may be formed in parallel. This may also apply for the processes explained below.

Note further that mask 18 may be removed prior to or after etching the first trench 50.

Thereafter, the first mask 17 may be removed. A thermal oxidizing of the first semiconductor region 3 may be performed so that a thermal oxide layer 17' is formed. Typically, the thermal oxide layer 17' has a maximum vertical extension which is larger than a vertical depth of the first trench 50. For example, thermal oxide layer 17' may have a vertical extension of about 200 nm for a first vertical trench 50 with a vertical extension of about 150 nm. The resulting semiconductor structure 100 is illustrated in FIG. 5A.

Thereafter, the thermal oxide layer 17' is typically removed. The resulting semiconductor structure 100 is illustrated in FIG. 5B. According to this process sequence, tapered and/or rounded side walls of the first trench 50 are formed. In other embodiments, forming and stripping of the thermal oxide layer 17' is omitted.

Thereafter, a second mask is formed on the first semiconductor region 3 which has an opening having, in the vertical cross-section, a second horizontal extension $w_2$ which is larger than the first horizontal extension $w_1$ of the first trench 50 and such that the first trench 50 is arranged within the opening when seen from above. This is followed by anisotropically etching the first semiconductor region 3 through the second mask to form a widened first trench 51. These processes are typically performed as STI-processes (Shallow Trench Isolation). In the exemplary embodiment, a hard mask layer 9a is formed on the first semiconductor region 3 as illustrated in FIG. 6A. The hard mask layer 9a is typically formed as a stack of dielectric layers. For example, a stack of silicon dioxide/silicon nitride/silicon dioxide may be formed on the first semiconductor region 3 as hard mask layer 9a. Thereafter, a resist mask 18a may be formed on the hard mask layer 9a and used to recess the hard mask layer 9a above the first vertical trench 50 so that the first trench 50 is completely arranged within the recess and opening, respectively, of the hard mask 9a when seen from above. In the exemplary embodiment, the first trench 50 is substantially centered with respect to the opening of the hard mask 9a when seen from above. In other embodiments, a center of the first trench 50 is shifted with respect to a center of the opening of the hard mask 9a when seen from above. The second horizontal extension $w_2$ of the opening of the hard mask 9a in the shown vertical cross-section is typically in a range from about 500 nm to about 200 μm, more typically in a range from about 1 μm to about 15 μm. Thereafter, a widened first trench 51 is formed by anisotropically etching the first semiconductor region 3 through the hard mask 9a forming the second mask. The resulting semiconductor structure 100 is illustrated in FIG. 6B.

Due to anisotropically etching the first semiconductor region 3, the widened first trench 51 has, in the shown vertical cross-sections, three substantially horizontal bottom wall portions 92', 93' and 94', and substantially vertical outer side walls. The vertical distance $D_2$ between the main surface 101 and the horizontal bottom wall portions 92' and 94' corresponds to the etching depth of the anisotropically etching process through the second mask 9a. The vertical distance $D_2$ may range from about 100 nm to about 1 μm, more typically from about 200 nm to about 800 nm. The vertical distance $D_3$ between the main surface 101 and the central horizontal bottom wall portions 92' and 94' is larger than the vertical distance $D_2$ and corresponds to the sum of etching depths of both anisotropically etching processes.

Thereafter, a dielectric material, for example silicon oxide, is deposited to fill the widened first trench 51. This may be achieved using a CVD-process (Chemical Vapor Deposition).

Figure 7:
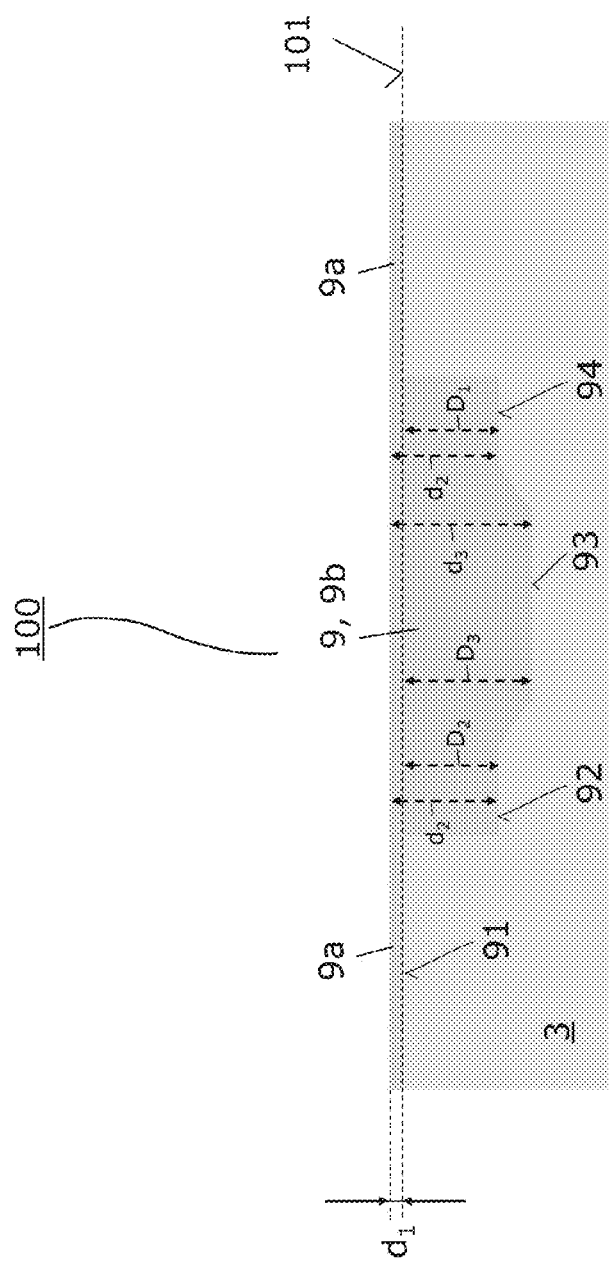

Thereafter, at least the deposited dielectric material is planarized to form an insulating structure 9 with a flat and substantially horizontal top surface onto which an electrode is to be formed. The resulting semiconductor structure is illustrated in FIG. 7.

Planarizing typically includes a CMP-process (Chemical Mechanical Polishing). The hard mask 9a may be used as a stop region in this process.

Depending on the amount and height, respectively, of a portion of the deposited dielectric material which protrudes above the hard mask 9a, the deposited dielectric material may be partly etched back above and/or next to the widened trench 51 prior to the CMP-process. For this purpose a third mask layer may be formed on the main surface 101; the third mask layer may be recessed at least above the widened first trench 51 to from a third mask; and the deposited dielectric material may be etched through the third mask.

Thereafter, an electrode is formed on the insulating structure 9, for example, by depositing a conductive material and masked back-etching. Accordingly, the electrode is insulated form the semiconductor body and typically substantially bar shaped in vertical cross-sections. The electrode typically forms a combined gate and field electrode.

According to an embodiment, the insulating structure 9 and the electrode are formed such that the insulating structure includes a gate dielectric portion 9a and a field dielectric portion 9b. The gate dielectric portion 9a forms a first horizontal interface 91 at least with a portion of the first semiconductor region 1 forming a drift region 3 and has a first maximum vertical extension $d_1$ above the first horizontal interface 91 and between the first horizontal interface 91 and the electrode, respectively. The field dielectric portion 9b forms, in the vertical cross-section, with the drift region 3 a second horizontal interface 92, a third horizontal interface 93 and a fourth horizontal interface 94 which are, in the vertical direction, arranged below the main surface 101. The second maximum vertical extension $d_2$ of the field dielectric portion 9b above the second horizontal interface 92 and between the second horizontal interface 92 and the electrode 13, respectively, is larger than the first maximum vertical extension $d_1$. A third maximum vertical extension $d_3$ of the field dielectric portion 9b above the third horizontal interface 93 and between the third horizontal interface 93 and the electrode 13, respectively, is larger than the second maximum vertical extension $d_2$.

Prior to or after forming the insulating structure 9, the following processes are typically performed. A body region of a second conductivity type may be formed in the first semiconductor region 3 next to the main surface 101. Next to the main surface 101 a source region or an emitter region of a first conductivity type and having a higher maximum doping concentration than the body region may be formed in the body region. In the first semiconductor region a field-stop region of the first conductivity type, which comprises a higher maximum doping concentration than the first semiconductor region, may be formed. Next to the main surface 101 a drain region of the first conductivity type having a higher maximum doping concentration than the first semiconductor region 3 or a collector region of the second conductivity type having a higher maximum doping concentration than the first semiconductor region 3 may be formed in the first semiconductor region 3. This may be done by respective implantation processes and drive-in. Further, an interlayer dielectric, a first and a second load metallizations, a gate metallization, as well as respective through contacts, may be formed on main surface 101. Accordingly, a field-effect semiconductor device as explained above with regard to FIGS. 1 to 3 may be formed. The semiconductor device is typically formed such that it includes a lateral power MOSFET-structure or a lateral power IBGT-structure.

According to an embodiment, the method for producing the lateral field-effect semiconductor device 100 includes: providing a semiconductor body comprising a first semiconductor region 1 of a first conductivity type extending to a main surface 101 having a normal direction defining a vertical direction; forming a first mask 17 on the main surface 101; forming a first trench 50 in the first semiconductor region 3 using the first mask 17 so that the first trench 50 has, in a vertical cross-section, a first horizontal extension $w_1$; forming a second mask 9a on the first semiconductor region 3 having an opening with a second horizontal extension $w_2$ which is larger than the first horizontal extension $w_1$ so that the first trench 50 is arranged within the opening when seen from above; anisotropically etching the first semiconductor region 3 through the second mask 9a to form a widened first trench 51; depositing a dielectric material to fill the widened first trench 51; and planarizing the dielectric material to form an insulating structure 9.

FIGS. 8A to 9B illustrate a method for forming a semiconductor device 101 according to several embodiments. These figures show vertical cross-sections through a semiconductor body during or after particular method steps. In a first process, a semiconductor body, typically a Si-wafer or Si-substrate, having a main surface 101 and a backside surface arranged opposite to the main surface 101 is provided. The normal direction $e_n$ of main surface 101 defines a vertical direction $e_n$. As explained above with regard to FIG. 4A, the semiconductor body typically includes a first semiconductor region 3 of a first conductivity type which extends to the main surface 101 and at least a portion of the first semiconductor region 3 forms a drift region in the semiconductor device to be manufactured. Furthermore, the semiconductor body may be covered on main surface 101 with a screen oxide layer. The screen oxide layer may be removed and a hard mask layer 9a is typically formed on the first semiconductor region 3. This may be done similarly as explained above with regard to FIG. 6a. However, the hard mask layer 9a is formed on the flat main surface 101 in this embodiment. Thereafter the hard mask layer 9a is recessed to expose the first semiconductor region 3 using, for example, a resist mask 18 to form a second mask 9a having a second opening which has a second horizontal extension $w_2$. The resulting semiconductor structure 110 is illustrated in FIG. 8A.

Thereafter, a first mask 18a, typically a resist mask, having a first opening which has, in the vertical cross-section, a first horizontal extension $w_1$ which is smaller than the second horizontal extension $w_2$ is formed on the first semiconductor region 3 and the second mask 9a, respectively, such that the first opening is arranged within the second opening when seen from above.

Thereafter, a first trench 50 is formed into the first semiconductor region 3 using the first mask 18a, typically by an anisotropic etching process. The resulting semiconductor structure 110 is illustrated in FIG. 8B. The first horizontal extension $w_1$ and the second horizontal extension $w_2$ may be chosen as explained above with regard to FIGS. 4B, 6B.

Thereafter, the first mask 18a is removed to expose the second mask 9a.

Figure 9A:
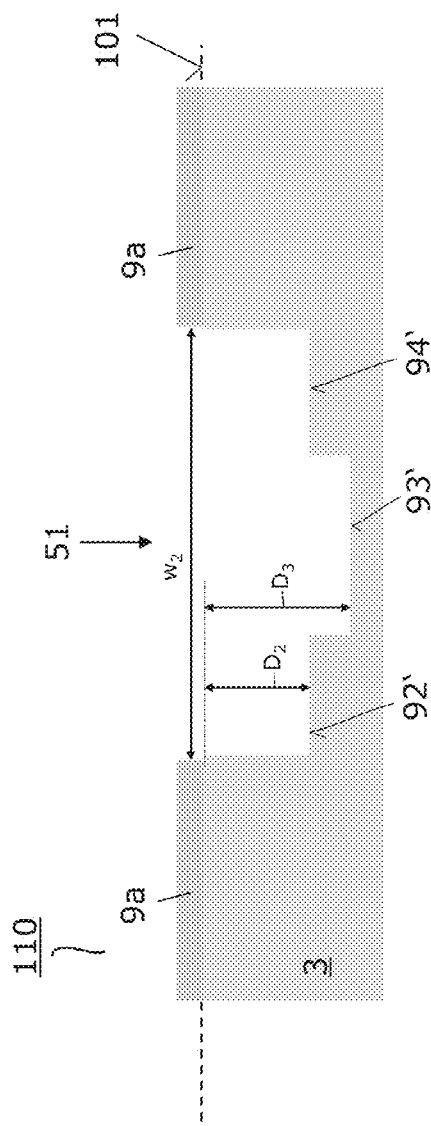
Figure 9B:
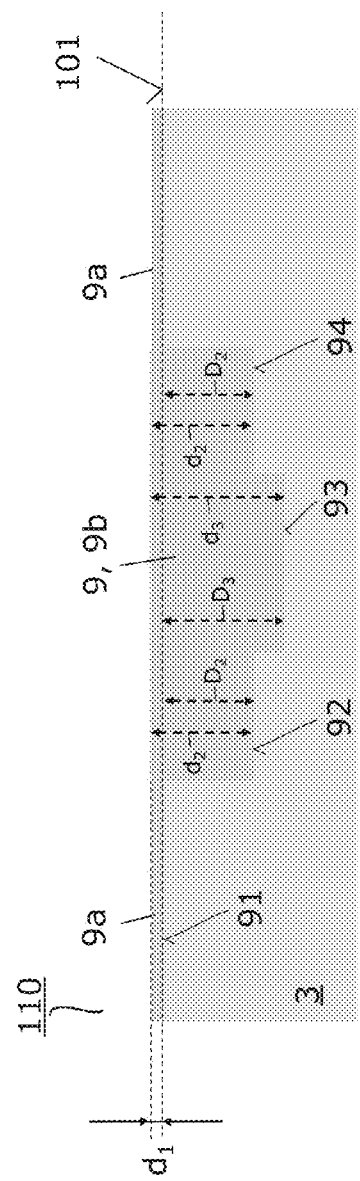

Thereafter, an anisotropic etching process of the first semiconductor region 3 through the second mask 9a is used to form a widened first trench 51; a dielectric material is deposited to fill the widened first trench 51; and at least the dielectric material is planarized to form an insulating structure 9. These processes are typically performed as explained above with regard to FIG. 7. The resulting semiconductor structure 110 is illustrated in FIG. 9B.

Semiconductor structure 110 is similar to the semiconductor structure 100 illustrated in FIG. 7. However, the third horizontal interface 93 adjoins the second horizontal interface 92 and the fourth horizontal interface 94 when the semiconductor structure 110 is seen from above.

Furthermore, at least a body region, a body contact region, a source or an emitter region, an optional field stop region, and a drain region or a collector region may additionally be formed as explained above with respect to FIG. 7. Further, an interlayer dielectric, a first and a second load metallization and a gate metallization as well as respective through contacts may be formed on main surface 101 of semiconductor device 110.

The methods explained above with regards to FIGS. 4A to 7 and 8A to 9B have in common that a widened trench 51 is formed using two anisotropic etching processes through a first mask and a second mask which are aligned to each other. More specifically, the first mask has a first opening and the second mask has a second opening, and the first mask and the second mask are formed such that the first opening and the first trench etched through the first opening, respectively, is arranged within the second opening when seen from above. In the embodiments explained above with regard to FIGS. 4A to 7, the first mask is removed prior to forming the second mask. In the embodiments explained above with regard to FIGS. 8A to 9B, the first mask is formed after forming the second mask and covers the second mask during the first anisotropic etching process. Both process sequences allow forming field oxides that are suitably thickened to increase the break-down voltage and/or to reduce the on-resistance of the field-effect structure. Furthermore, both process sequences allow forming a thickened field oxide only for the field-effect structure of an integrated semiconductor device which has the highest rated blocking capability. Accordingly, integrated semiconductor devices with structures of different rated blocking capability may be formed in a simple and cost-efficient manner.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a semiconductor body having a main surface with a normal direction defining a vertical direction, the semiconductor body comprising in a vertical cross-section:
        a first contact region of a first conductivity type which extends to the main surface;
        a body region of a second conductivity type which adjoins the first contact region and extends to the main surface;
        a drift region of the first conductivity type which adjoins the body region and extends to the main surface; and
        a second contact region which comprises a higher maximum doping concentration than the drift region and extends to the main surface;
    an electrode arranged on the main surface; and
    an insulating structure which insulates the electrode from the semiconductor body and comprises in the vertical cross-section:
        a gate dielectric portion which forms a first horizontal interface at least with the drift region and has a first maximum vertical extension between the first horizontal interface and the electrode; and
        a field dielectric portion which forms with the drift region a second horizontal interface, a third horizontal interface and a fourth horizontal interface, wherein the second horizontal interface, the third horizontal interface and the fourth horizontal interface are, in the vertical direction, arranged below the main surface, wherein the third horizontal interface is arranged between the second horizontal interface and the fourth horizontal interface, wherein a second maximum vertical extension of the field dielectric portion between the second horizontal interface and the electrode is larger than the first maximum vertical extension, wherein a third maximum vertical extension of the field dielectric portion between the third horizontal interface and the electrode is larger than the second maximum vertical extension, and wherein the electrode only partially overlaps the third horizontal interface.

2. The semiconductor device of claim 1, wherein the gate dielectric portion adjoins the field dielectric portion.

3. The semiconductor device of claim 1, wherein the electrode overlaps with the first contact region, the body region, the drift region, the gate dielectric portion, the first horizontal interface, the second horizontal interface and the third horizontal interface.

4. The semiconductor device of claim 1, wherein the second contact region is of the first conductivity type and adjoins the field dielectric portion.

5. The semiconductor device of claim 1, wherein the second horizontal interface, the third horizontal interface and the fourth horizontal interface are spaced apart from each other when seen from above.

6. The semiconductor device of claim 1, wherein a horizontal extension of the second horizontal interface is smaller than a horizontal extension of the fourth horizontal interface.

7. The semiconductor device of claim 1, wherein a horizontal extension of the second horizontal interface is smaller than a horizontal extension of the third horizontal interface and substantially equal to a horizontal extension of the fourth horizontal interface.

8. The semiconductor device of claim 1, wherein the electrode is, in the vertical cross-section, substantially bar-shaped.

9. The semiconductor device of claim 1, wherein a horizontal extension of the second horizontal interface is larger than a horizontal extension of the fourth horizontal interface.

10. The semiconductor device of claim 1, wherein the semiconductor body further comprises a deep body region of the second conductivity type having a higher maximum doping concentration than the body region, adjoining the body region and arranged below the body region.

* * * * *